(12) United States Patent
Nakamura

(10) Patent No.: US 6,307,271 B1
(45) Date of Patent: Oct. 23, 2001

(54) SEMICONDUCTOR DEVICE HAVING PADS, THE INTERVALS OF WHICH ARE ADJUSTED AND ARRANGED IN SEMICONDUCTOR CHIP CORNERS

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/516,505

(22) Filed: Mar. 1, 2000

(30) Foreign Application Priority Data

Apr. 27, 1999 (JP) .................................................. 11-119732

(51) Int. Cl.$^7$ ........................... H01L 23/48; H01L 23/52; H01L 29/40
(52) U.S. Cl. ........................ 257/786; 257/784; 257/779; 257/203; 257/208
(58) Field of Search .................................... 257/786, 784, 257/203, 208, 779

(56) References Cited

U.S. PATENT DOCUMENTS 5,818,114 * 10/1998 Pendse et al. ....................... 257/786

FOREIGN PATENT DOCUMENTS

| 2-119233 | 5/1990 | (JP) . |
| 5-186649 | 7/1990 | (JP) . |
| 407297348-A | * 11/1995 | (JP) . |

* cited by examiner

*Primary Examiner*—Tom Thomas
*Assistant Examiner*—Luan Thai
(74) *Attorney, Agent, or Firm*—Rabin & Berdo, P.C.

(57) ABSTRACT

A semiconductor pullet 1 includes an integrated circuit formed in the central area of the pellet 1, first electric pads 2 arranged in a line in the peripheral area and second electric pads 3 connected to the conductive lines 4 each of which has a second width L. The first pad 2 has a first width S1 and arranged with a first interval P. The second pads 3 have a third width S2 and are located outside of the first pads 2 in a parallel line to the line of said first pads with a second interval C. The first, second and third widths S1, L, S2 and the first interval P has the relationship P>S2>S1+L. Each of the second pads 3 are located at the positions corresponding to the middle positions between the first pads 2 adjoining each other where the second pads 3 are located in a first area (region A) which is inside of straight lines from a center of the semiconductor pellet having an angle θ with a side of the semiconductor pellet 1, in which θ>tan$^{-1}$(2C/(P−S1)). Further, each of the second pads 3 are located at the positions shifting in a direction towards a corner of the semiconductor pellet 1 from the middle positions where the second pads 3 are located in a second area (region B) which is outside of the first area (region A).

5 Claims, 15 Drawing Sheets

(A)

(B)

(A)

(B)

SEMICONDUCTOR DEVICE HAVING PADS, THE INTERVALS OF WHICH ARE ADJUSTED AND ARRANGED IN SEMICONDUCTOR CHIP CORNERS

BACKGROUND OF THE INVENTION

The present invention relates to a pad arrangement and pad structure of a semiconductor device, and more particularly to a semiconductor pellet having electric pads arranged in a plurality of parallel lines on the periphery thereof.

In the semiconductor device, the electric pads are supplied in order to provide voltage and input-output a signal for functioning as a circuit. The electric pad is electrically connected to a substrate for a ball grid array (BGA) and a lead frame as an input/output terminal of a semiconductor integrated circuit. In order to shorten the distance for wire bonding connection, the electric pads are generally formed on the periphery of the semiconductor pellet. The wire bonding connection is performed using a metal ball made from for example gold pressed to the electric pad. Connecting points are then bridged through the empty space by a thin wire which is then pressed to the lead frame. Thus, the electric pads require a much wider area than the area of the portion in which the metal ball is pressed.

On the other hand, as a result of integrated circuits becoming microscopic, the number of electric pads provided in the semiconductor pellet increases. Because of this, it becomes difficult to arrange the electric pads in a line on the periphery of the semiconductor pellet. To overcome this, the electric pads are arranged in double lines for a semiconductor pellet where many electric pads are provided.

The conventional technology in which the electric pads are arranged in double lines is disclosed in Japanese laid-open-patent No. HEI 2-119233 and HEI 2-186650.

However, in a semiconductor pellet having electric pads with the above described double line structure, when the connecting points between the electric pads and the lead frame or the substrate have been connected electrically by wire bonding, there can be a problem where the distance between the thin metal wires of the wire bonding causes short-circuits because of the semiconductor pellet's position, deviation, and so forth.

SUMMARY OF THE INVENTION

The object of the present invention is providing a semiconductor pellet where the thin metal wires do not short-circuit electrically. To achieve the above object, the present invention discloses the arrangement of the pads in the semiconductor pellet having a central area and a peripheral area. The semiconductor pullet includes an integrated circuit formed in the central area of the pellet, first electric pads arranged in a line in the peripheral area and second electric pads connected to the conductive lines each of which has a second width L. The first pad has a first width S1 and arranged with a first interval P The second pads have a third width S2 and are located outside of the first pads in a parallel line to the line of said first pads with a second interval C. The first, second and third widths S1, L, S2 and the first interval P has the relationship P>S2>S1+L. Each of the second pads are located at the positions corresponding to the middle positions between the first pads adjoining each other where the second pads are located in a first area which is inside of straight lines from a center of the semiconductor pellet having an angle θ with a side of the semiconductor pellet, in which θ>tan$^{-1}$(2C/(P−S1)). Further, each of the second pads are located at the positions shifting in a direction towards a corner of the semiconductor pellet from the middle positions where the second pads are located in a second area which is outside of the first area.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

Figure 1:
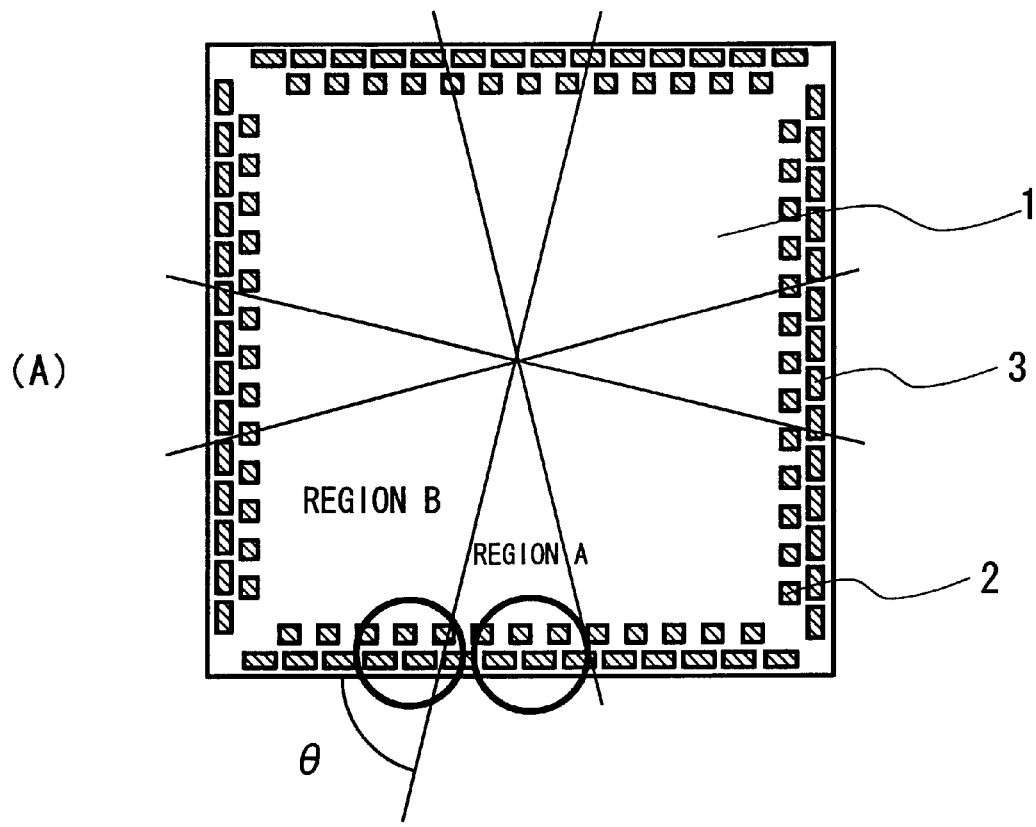
FIG. 1 illustrates a semiconductor pellet of the first embodiment.
Figure 1:
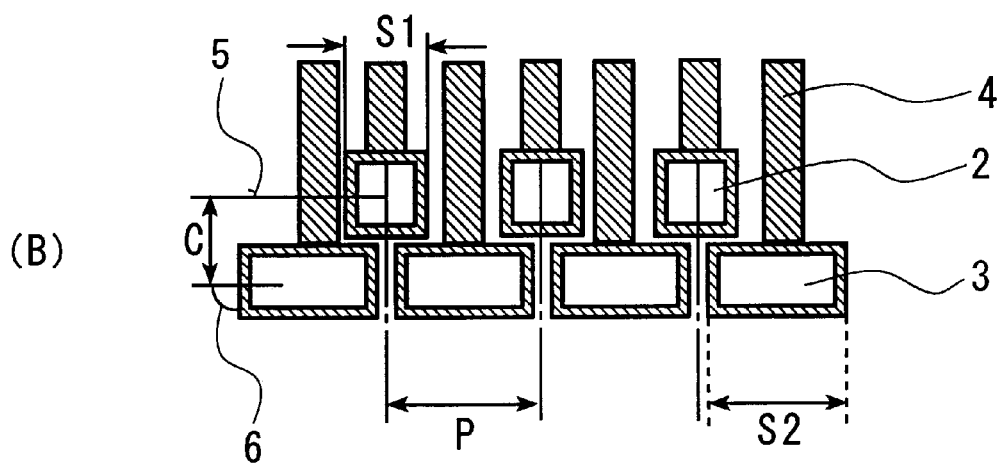
Figure 2:
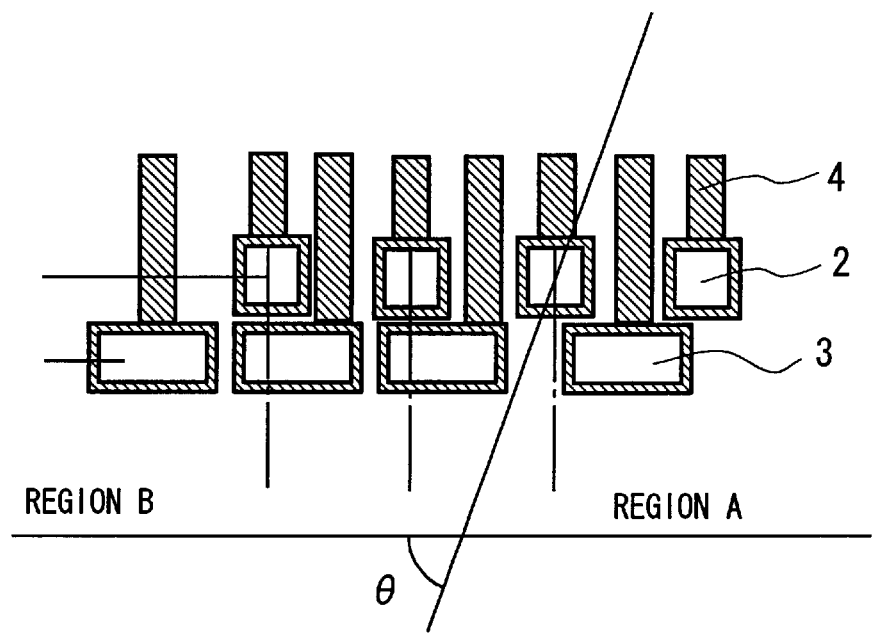
FIG. 2 illustrates a part of the semiconductor pellet of the first embodiment.

FIGS. 1(A) and 1(B) and FIG. 2 illustrate a semiconductor pellet of the first embodiment of the present invention. As shown in FIG. 1(A), the first electric pads 2 the shape of which are nearly a square, are positioned at a uniform distance in a line inside the periphery of the semiconductor pellet 1. The second electric pads 3, the shape of which is rectangular, are arranged in a line outside the first electric pads 2. Although not shown in detail in the figure, an integrated circuit is included in the middle portion of the semiconductor pellet 1.

The semiconductor pellet 1 is partitioned into two regions by four straight lines. It is defined that a narrow region partitioned by straight lines, that is to say, the region of the middle portion of each side of the semiconductor pellet 1 is A, and the region other than that (the region close to the corner portion of the semiconductor pellet 1) is the region B. The arrangement of the region A of the second electric pads 3 is not the same as the arrangement of the region B of the second electric pads 3. FIG. 1(B) and FIG. 2 explain this in more detail.

FIG. 1(B) is a detail view showing the relative locations of the first electric pad 2 and the second electric pad 3 in the region of the semiconductor pellet 1 shown in FIG. 1(A). Each of the almost square shaped first electric pads 2, the side length of which is S1, is electrically connected to the integrated circuit through an electrical wire 4. Although the width of the electrical wire 4 varies according to its application, the width L=0.04 mm is applied in the present embodiment. The first electric pads 2 are arranged in a straight line (a line) whilst keeping a constant interval P (here, the interval P is the distance between the center points of the first electric pads 2).

Each of the second electric pads 3 formed in a rectangular shape, the short length of which is equal to the side length S1 of the first electric pads 2 is electrically connected to the integrated circuit through the electrical wire 4. The electrical wire is provided in order to pass between the first electric pads 2. The second electric pads 3 are arranged in a straight line (a line) outside the first electric pads 2. An imaginary center line 5 on which the first electric pads 2 are arranged is parallel with an imaginary center line 6 on which the second electric pads 3 are arranged. The distance C includes a supplementary distance for arranging the electrical pads and is larger than the side length S1. Further, the shape of the second electric pads 3 is a rectangle, the long side of which extends from the close vicinity of the position corresponding to the center position of the first electric pads 2 to the close vicinity of the position corresponding to the center position of the adjacent first electric pads 2. Namely, the second electric pads 3 are positioned in order for the center point to be located in the middle point of the first electric pads 2. Thus, the long side length S2 of the second electric pads 3 has the relationship P>S2>S1+L.

FIG. 2 is a view showing in detail the relative locations of the first and the second electric pads 2 and 3 in the semiconductor pellet region B (containing a part of the region A) shown in FIG. 1(A). The explanation for the first electric pads 2 is omitted because it is the same as the region A.

The second electric pads 3 are the same as the region A with regard to their shapes, connection with the electrical wire 4, and the straight line arrangement. With regard to the second electric pads 3 in the region B, the difference between this and the region A is the relative location of each of the second electric pads 3 to each of the first electric pads 2. That is to say, the center position of each of the second electric pads 3 is not the central position between the first electric pads 2, but is in a position shifted towards the corner. In this preferred embodiment, in the region B, the short side of the second electric pads 3 close to the corner of the semiconductor pellet 1 matches with the side of the first electric pads 2 close to the corner of the semiconductor pellet 1 and the side of the semiconductor pellet 1 by a vertical line.

Figure 3:
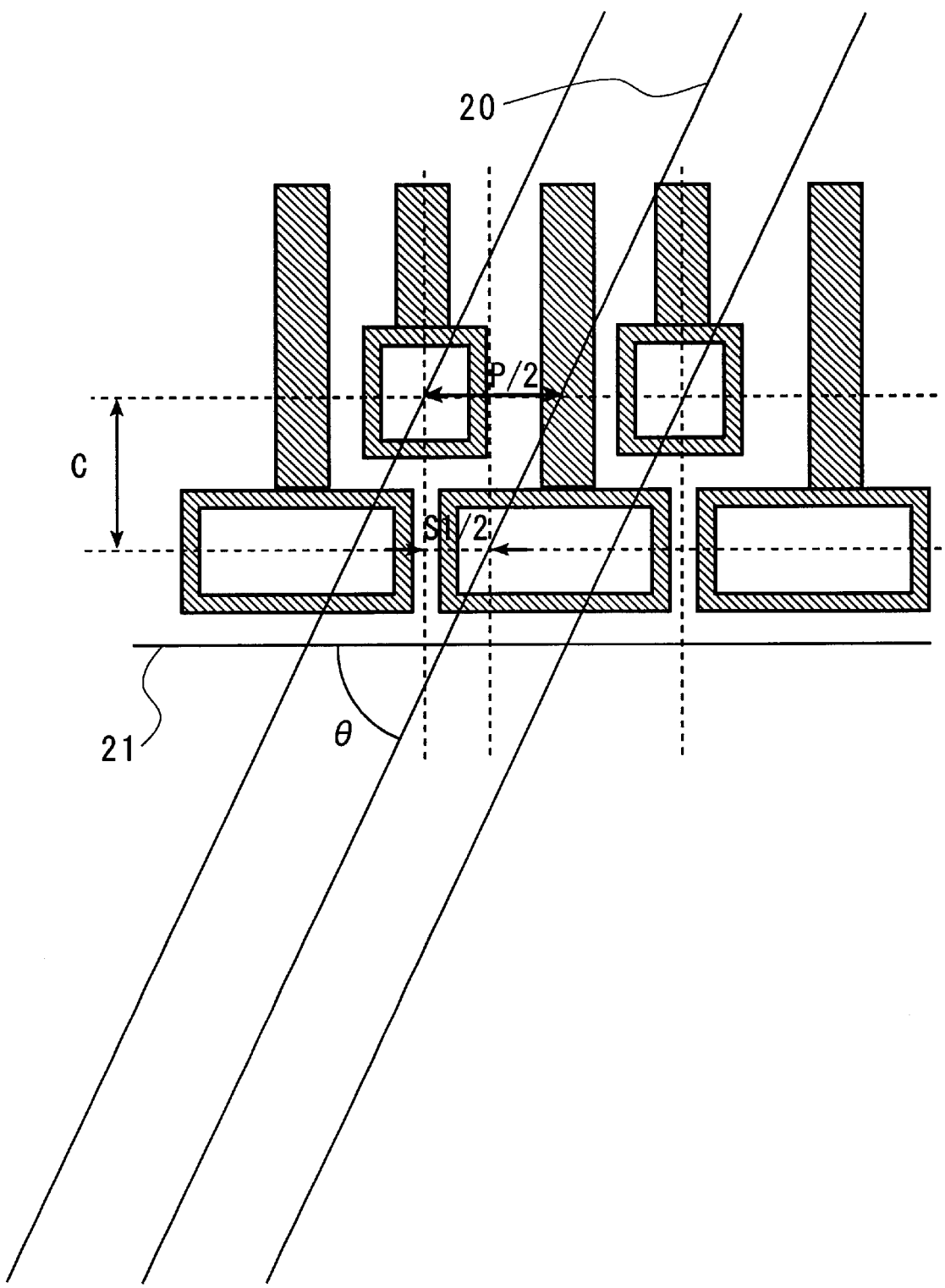
FIG. 3 is a view explaining a setting limit of the semiconductor pellet of the first preferred embodiment.

Next, it is explained why the regions are separated into the region A and the region B. The location of each of the second electric pads 3 is changed, and the regions are provided. FIG. 3 is a view explaining the setting limit of the semiconductor pellet of the first preferred embodiment.

In FIG. 3, the wire bonding direction is designated in the case where wire bonding is performed with an arrangement correlation between the first and the second electric pads 2 and 3 as seen in the region A. As already explained in the conventional technology, a metal ball is physically pressed down at the start point or the end point (end point: namely, the electric pad and the lead frame or the substrate) of wire bonding. In electric pads, the positioning adjustment is performed in order for the metal ball to locate in the middle of the electric pads, but positioning error may occur based on machine precision. For the first electric pads 2, the shape of which is nearly a square, the size is determined based on the consideration of this positioning error shift margin evaluated in both the vertical and the horizontal directions. On the other hand, for the second electric pads 3, a square the short side length of which is the same as the side length of each of the first electric pads 2 is formed. This is because the positioning error shift margin in the vertical direction must be the same as the first electric pads 2, and the positioning error shift margin for the horizontal direction must be acceptable to allow the variation in an object to be wire bonded (it is common that the same kind of semiconductor pellet is connected to the lead frame through wire bonding and BGA packaging is implemented by wire bonding being applied to the substrate).

A metal wire is wire-bonded in the radial direction from the center of the semiconductor pellet 1. That is to say, in the central portion (region A) of the side of the semiconductor pellet 1, bonding is performed in the direction nearly perpendicular to this side. Thus, as shown in FIG. 1(B), if the center of the second electric pad 3 is arranged in the middle of the first electric pad 2, the possibility of the wire-bonded thin metal wire short-circuiting is reduced. However, the arrangement explained in the above is difficult to successfully perform in the close vicinity of B which is the corner of the semiconductor pellet 1.

As shown in FIG. 3, since wire bonding is performed to the lead frame, etc. in the region B at an angle with the first and the second electric pads 2 and 3, the metal ball should be located in an area where there is shifted with a significant distance from the central portion. This is in order for the thin metal wire wire-bonded from the second electric pads 3 to be located at a very close proximity to the thin metal wire wire-bonded from the first electric pads 2. When the horizontal positioning error shift margin is considered, the limit of the position in which the center of the metal ball is capable of being located is in the range from the short side length of the second electric pads 3 in the close vicinity of the corner of the semiconductor pellet 1, to half of the side length S1 of the first electric pads 2, namely, S1/2. The calculation is performed without considering the margin for separating the adjacent second electric pads 3. When the margin δ is considered, it is possible that "p/2−S1/2−δ" is used instead of "p/2−S1/2." A crossing angle θ(θ<90°) between a straight line 20 passing through the limit of the position and a side 21 of the semiconductor is expressed as follows:

$$\tan \theta = C/(P/2 - S1/2)$$

$$\therefore \theta = \tan^{-1}(2C/(P-S1))$$

When the angle θ is smaller than this value, wire bonding cannot be performed if the position correlation between the first and the second electric pads 2 and 3 in the region A is maintained. Thus, wire bonding can be successfully performed as explained above if the position correlation between the first electric pads 2 and the second electric pads 3 is made in the region B where the short side of the second electric pads 3 in the close vicinity of the corner of the semiconductor pellet 1 is shifted closer towards the corner side of the semiconductor pellet 1.

Figure 4:
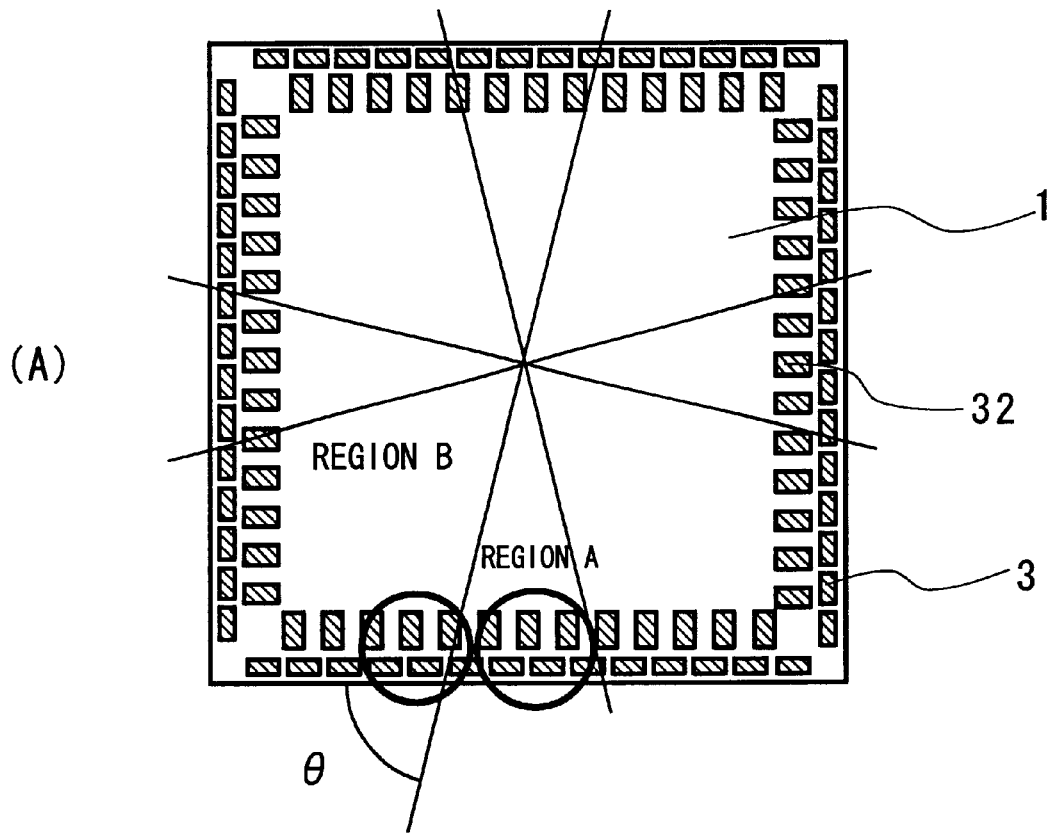
FIG. 4 illustrates a modified example of the semiconductor pellet of the first preferred embodiment.
Figure 4:
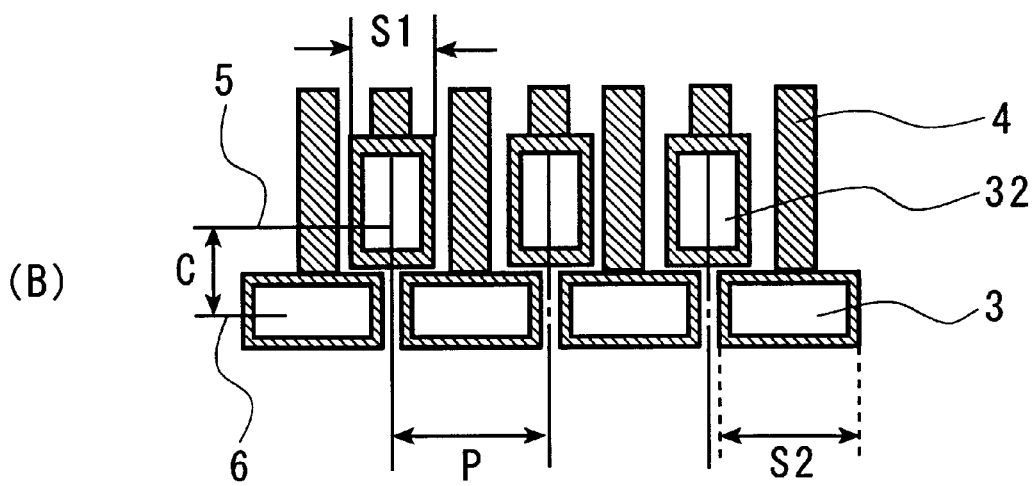
Figure 5:
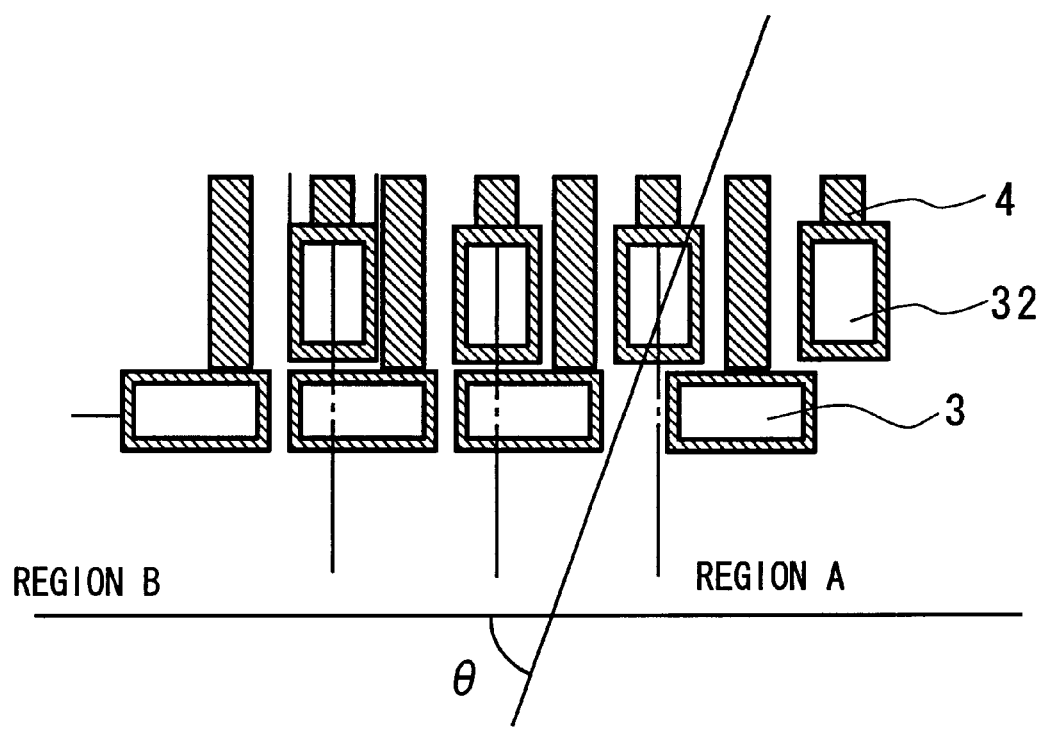
FIG. 5 illustrates a part of the modified example of the semiconductor pellet of the first preferred embodiment.

FIGS. 4(A) and 4(B) and FIG. 5 illustrate a modified example of a semiconductor pellet of the first preferred embodiment of the present invention. The explanation of the parts of FIGS. 4(A) and 4(B) and FIG. 5 with the same reference numbers as FIGS. 1(A) and 1(B) and FIG. 2 are omitted. As shown in FIG. 4(A), the first electric pad 32 is formed in a rectangular shape in which the side in the direction toward the center of the semiconductor pellet 1 is the long side of the rectangle in the modified example of the first preferred embodiment. The other components are the same as the first preferred embodiment. The short side of the first electric pads 32 is S1, the same as the first preferred embodiment.

In addition to the effect of the first preferred embodiment, it is possible that wire binding is performed with a greater degree of freedom in the modified example of the first preferred embodiment. This is possible because the wire bonding position of the first electric pads 32 can be shifted towards the center direction (or its reverse direction) of the first electric pads 32.

Figure 6:
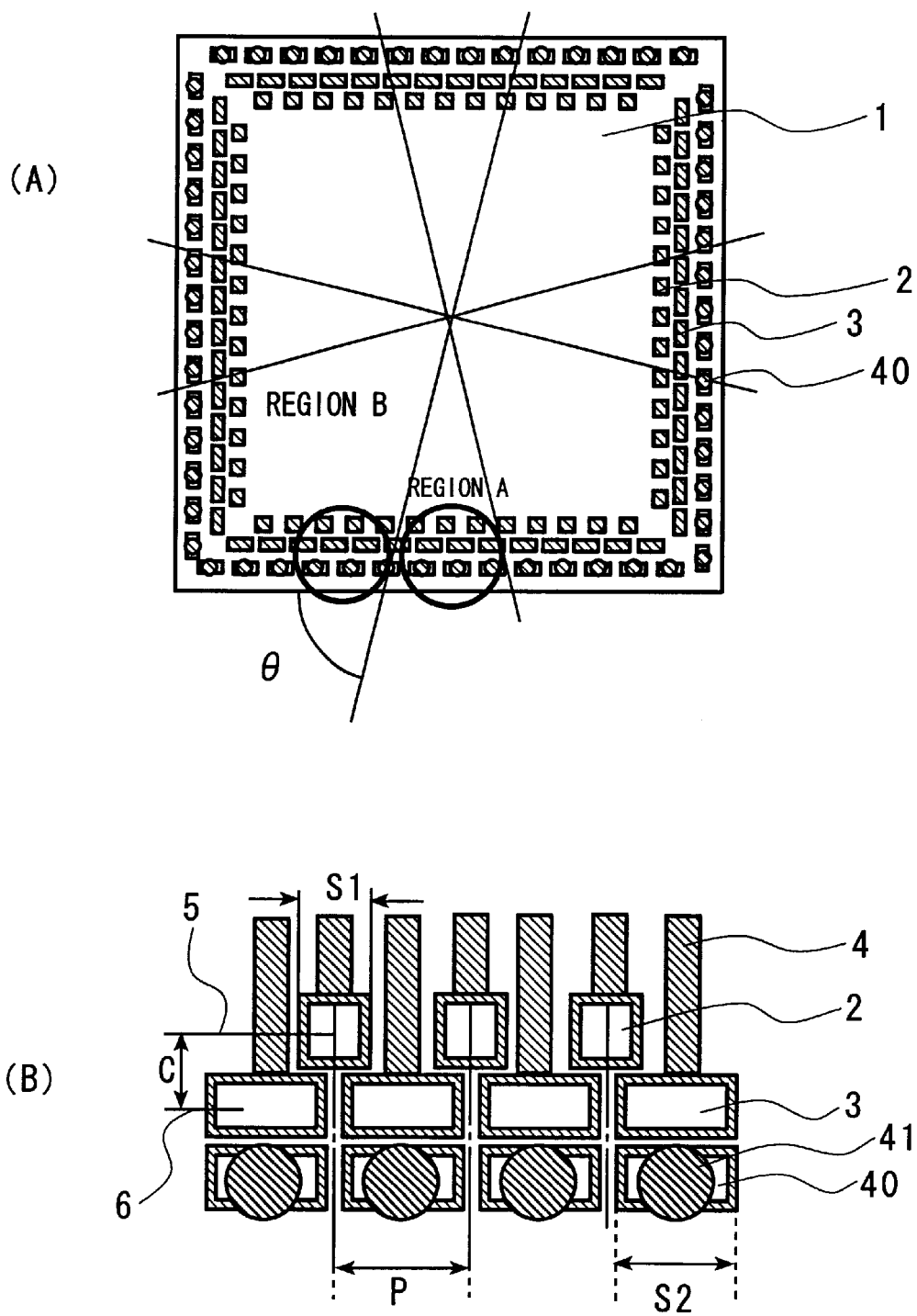
FIG. 6 illustrates a semiconductor pellet of the second preferred embodiment.
Figure 7:
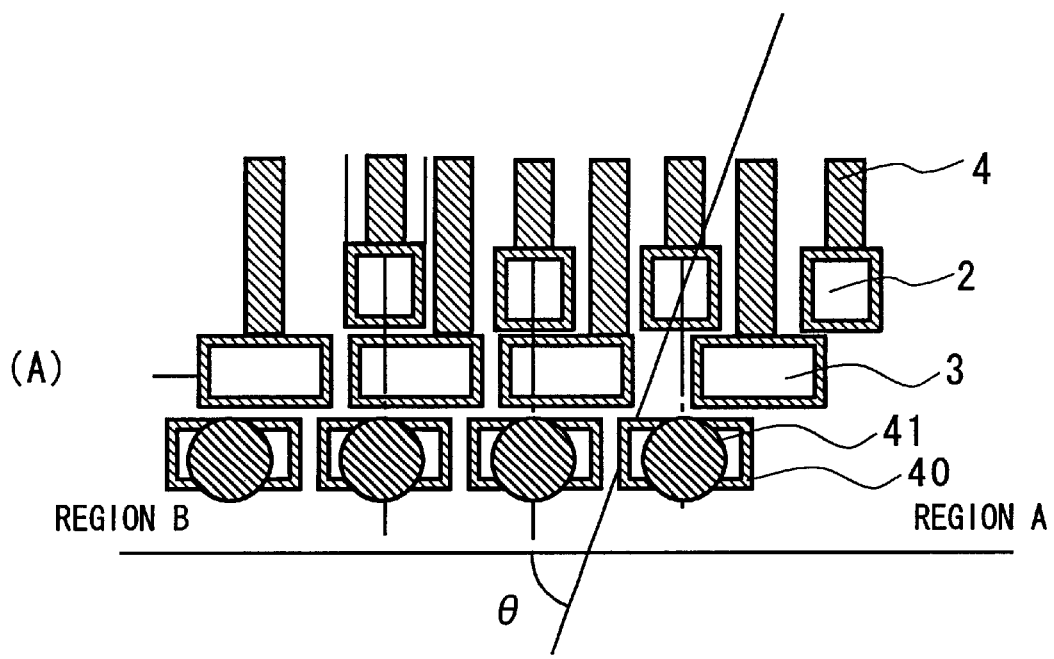
FIG. 7 illustrates a part of the semiconductor pellet of the second preferred embodiment.
Figure 7:
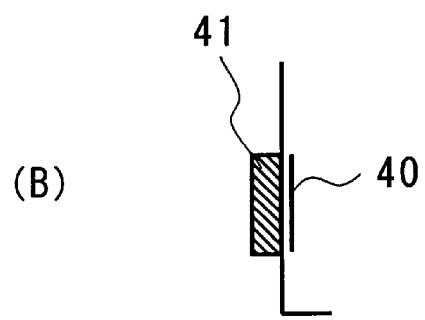

FIGS. 6(A) and 6(B) and FIGS. 7(A) and 7(B) illustrate a semiconductor pellet of the second preferred embodiment of the present invention. In FIGS. 6(A) and 6(B) and FIG. 7(A), the explanation is omitted for those parts having the same reference numbers as the parts in FIGS. 1(A) and 1(B) and FIG. 2.

As shown in FIG. 6(A), dummy electric pads 40 are arranged in a line outside the second electric pads 3 in the semiconductor pellet 1 of the second preferred embodiment. As shown in FIG. 6(B), in the region A, each of the dummy electric pads 40 are arranged on the outside position matching with each of the second electric pads 3. In the region B, as shown in FIG. 7(A), each of the dummy electric pads 40 is arranged in a position slightly shifted towards the corner side of the semiconductor pellet 1 from the second electric pads 3. A cylindrical metal layer 41 is provided in each of the dummy electric pads 40. The cylindrical metal layer 41 is physically pressed down and formed in the same way as the wire bonding metal ball. The thickness d of the cylindrical metal layer 41 is 3 to 10 $\mu$m as shown in FIG. 7(B).

The surface of the semiconductor pellet 1 is covered by resin. The thermal expansion coefficient is generally not the same between the semiconductor pellet 1 and the resin. Resin creates stress between the wire-bonded metal ball and a boundary surface between the first electric pads 2 and the second electric pads 3 by heat shrinkage. The cylindrical metal layer 41 is provided in order to reduce the stress due to heat shrinkage. The stress due to heat shrinkage is distributed not only to the wire-bonded metal ball but also to the cylindrical metal layer 41. The further out the position of the semiconductor pellet 1 is located, the stronger the stress due to heat shrinkage. Since the cylindrical metal layer 41 is provided outside the metal ball, the stress due to heat shrinkage is distributed mostly to the cylindrical metal layer 41. As a result, the stress distributed to the metal ball is reduced. As explained above, in the semiconductor pellet 1 of the second preferred embodiment, the stress on the wire-bonded metal ball is reduced in addition to the effect achieved in the first preferred embodiment.

FIGS. 8(A) and 8(B) and FIGS. 9(A) and 9(B) illustrate a modified example of the semiconductor pellet of the second preferred embodiment of the present invention. In FIGS. 8(A) and 8(B) and FIGS. 9(A) and 9(B), the explanation is omitted for those parts with the same reference numbers as FIGS. 6(A) and 6(B) and FIGS. 7(A) and 7(B).

Figure 8:
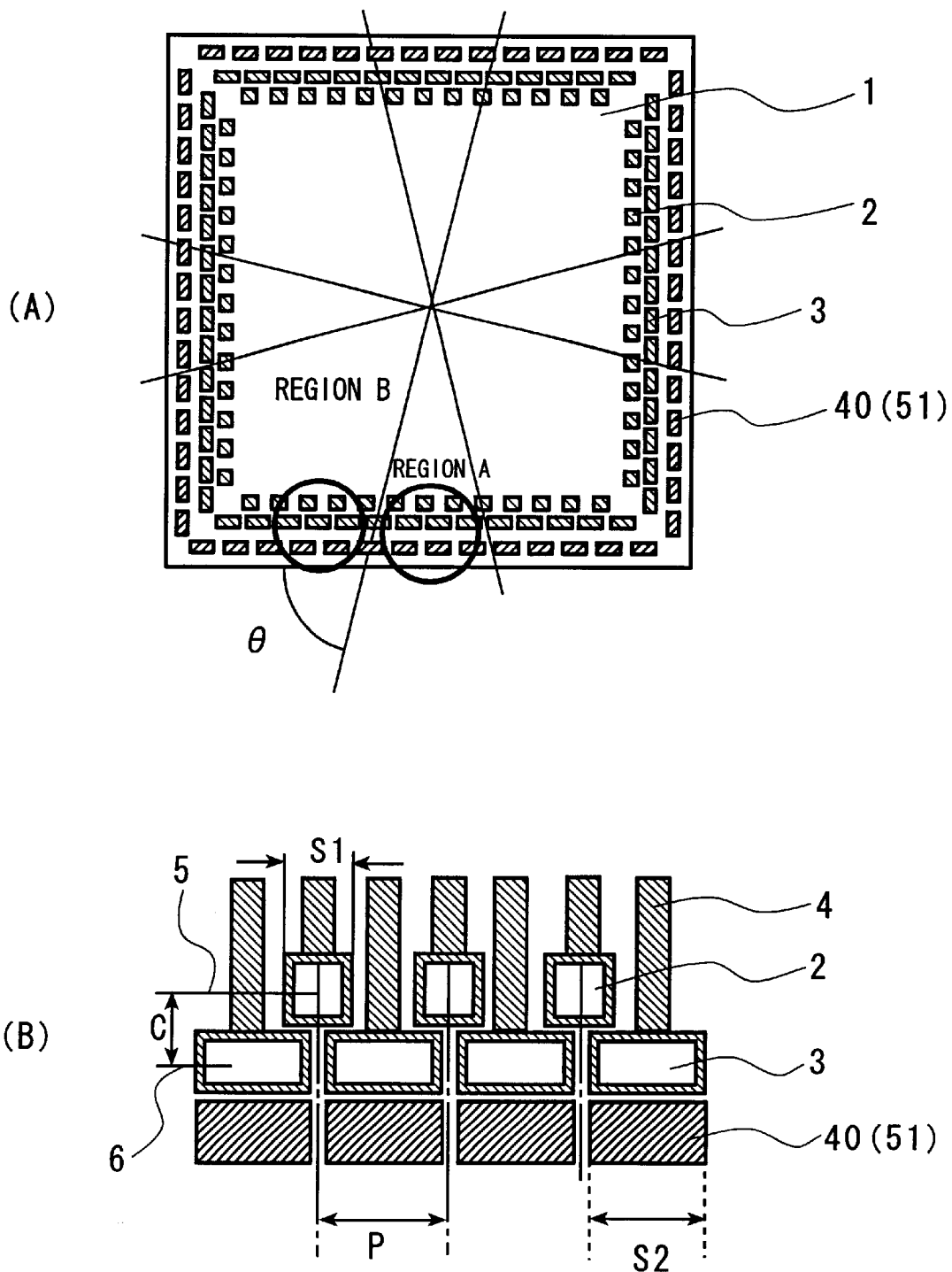
FIG. 8 illustrates a modified example of the semiconductor pellet of the second preferred embodiment.
Figure 9:
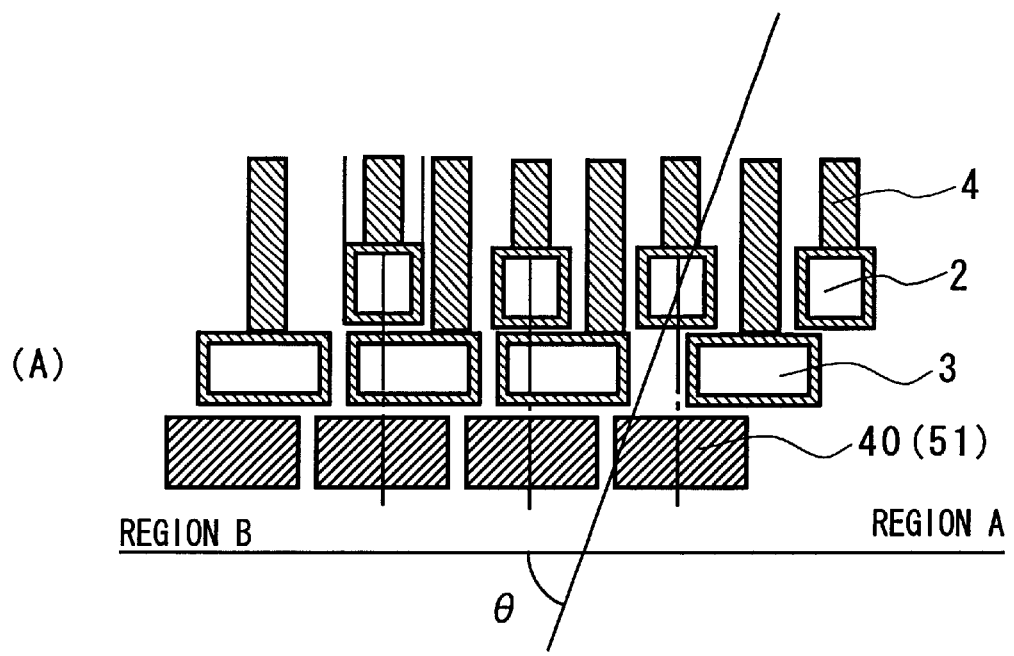
FIG. 9 illustrates a part of the modified example of the semiconductor pellet of the second preferred embodiment.
Figure 9:
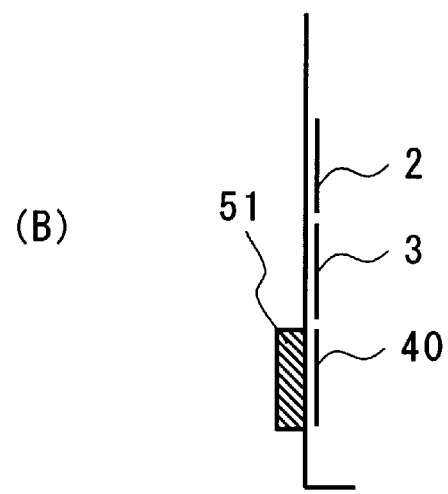

As shown in FIG. 8(A), in the modified example of the semiconductor pellet 1 of the second preferred embodiment, the dummy electric pads 40 are arranged in a line outside the second electric pads 3 in the same way as the second preferred embodiment. Each of the metal layers 51 the shape of which is the same is provided on each of the dummy electric pads 40. Each of the metal layers 51 is provided on each of the dummy electric pads 40 by evaporation or plating. Each thickness of the metal layers 51 is 3 to 10 $\mu$m in the same way as the second preferred embodiment. In the modified example of the second preferred embodiment, the production time can be reduced and easy production is possible in addition to the effect achieved in the second preferred embodiment, due to the metal layers 51 being provided by evaporation or plating.

FIGS. 10(A) and 10(B) and FIGS. 11(A) and 11(B) illustrate a semiconductor pellet of the third preferred embodiment of the present invention. In FIGS. 10(A) and 10(B) and FIGS. 11(A) and 11(B), the explanation is omitted for those parts with the same reference numbers as the parts in FIGS. 8(A) and 8(B) and FIGS. 9(A) and 9(B).

Figure 10:
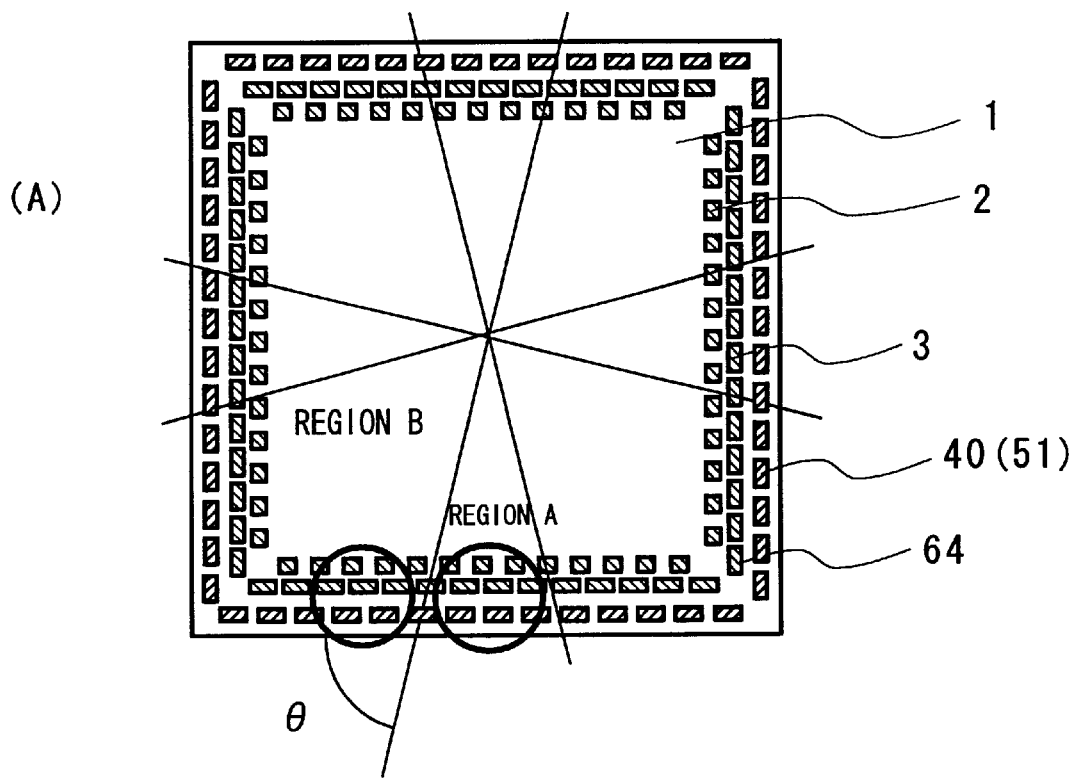
FIG. 10 illustrates a semiconductor pellet of the third preferred embodiment.
Figure 10:
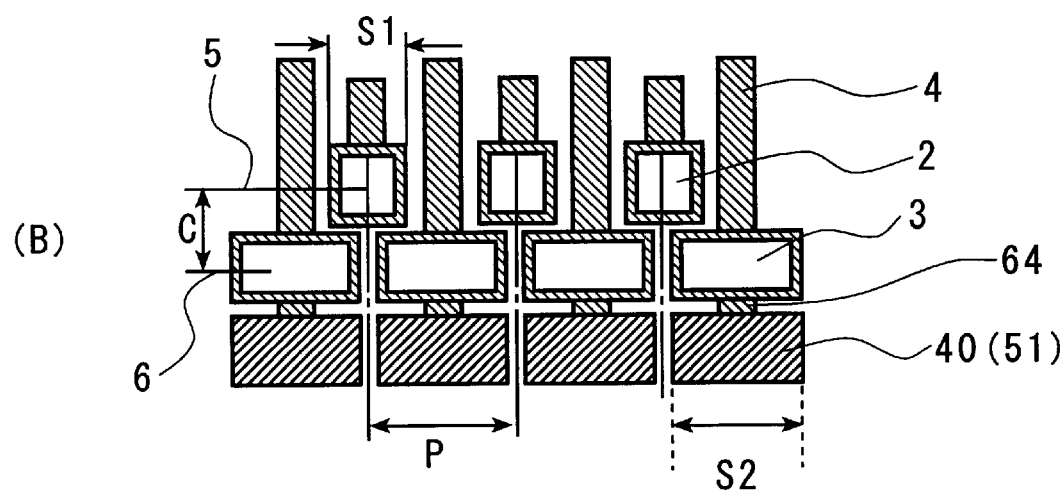
Figure 11:
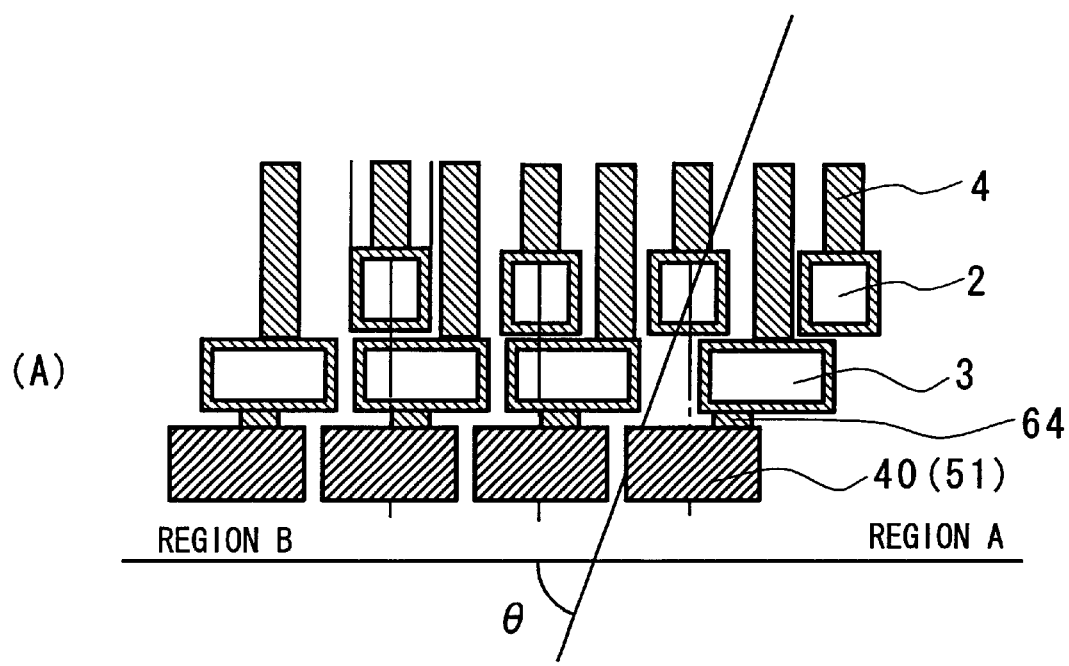
FIG. 11 illustrates a part of the semiconductor pellet of the third preferred embodiment.
Figure 11:
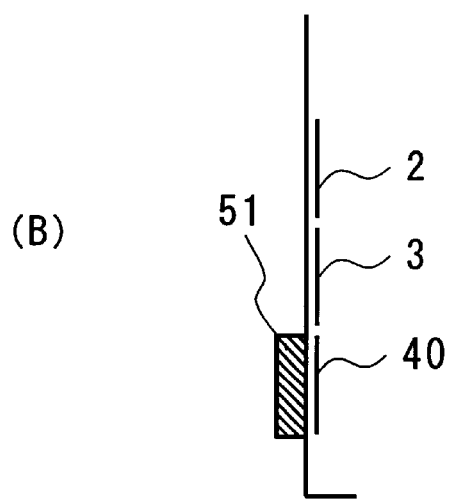

In the semiconductor pellet 1 of the third preferred embodiment, as shown in FIG. 10(A), each of the second electric pads 3 is connected through an electrical wire 64 to each of the dummy electric pads 40 provided outside each of the second electric pads 3. The other parts are the same as the modified example of the second preferred embodiment.

The dummy electric pads 40 in which the metal layers 51 are provided can be used as electric pads for an electric performance test because each of the dummy electric pads 40 is electrically connected to each of the second electric pads 3. The method called "proving" where a test terminal is contacted with the electric pad is commonly used as an electric performance test. When a test terminal is used for the second electric pad 3 to which bonding is later undertaken, there is a possibility that a scratch may be made by the test terminal contacting with the pad and a problem may arise with regard to reliability. According to the semiconductor pellet 1 of the third preferred embodiment, however, the electric performance test for the second electric pads 3 is undertaken where the test terminal is contacted with the metal layers 51 provided on the dummy electric pads 40. Since each thickness of the metal layers 51 is 3 to 10 $\mu$m, there is no problem even if the metal layers 51 are scratched due to contact with the test terminal. Further, a several $\mu$m allowance is provided in the direction towards the height of the test terminal as an alignment precision. Thus the result is, the time required to adjust the alignment in the direction towards the height of the test terminal can be reduced.

FIGS. 12(A) and 12(B) and FIGS. 13(A) and 13(B) illustrate a modified example of the semiconductor pellet of the third preferred embodiment of the present invention. In FIGS. 12(A) and 12(B) and FIGS. 13(A) and 13(B), the explanation is omitted for those parts with the same reference numbers as the parts in FIGS. 10(A) and 10(B) and FIGS. 11(A) and 11(B).

Figure 12:
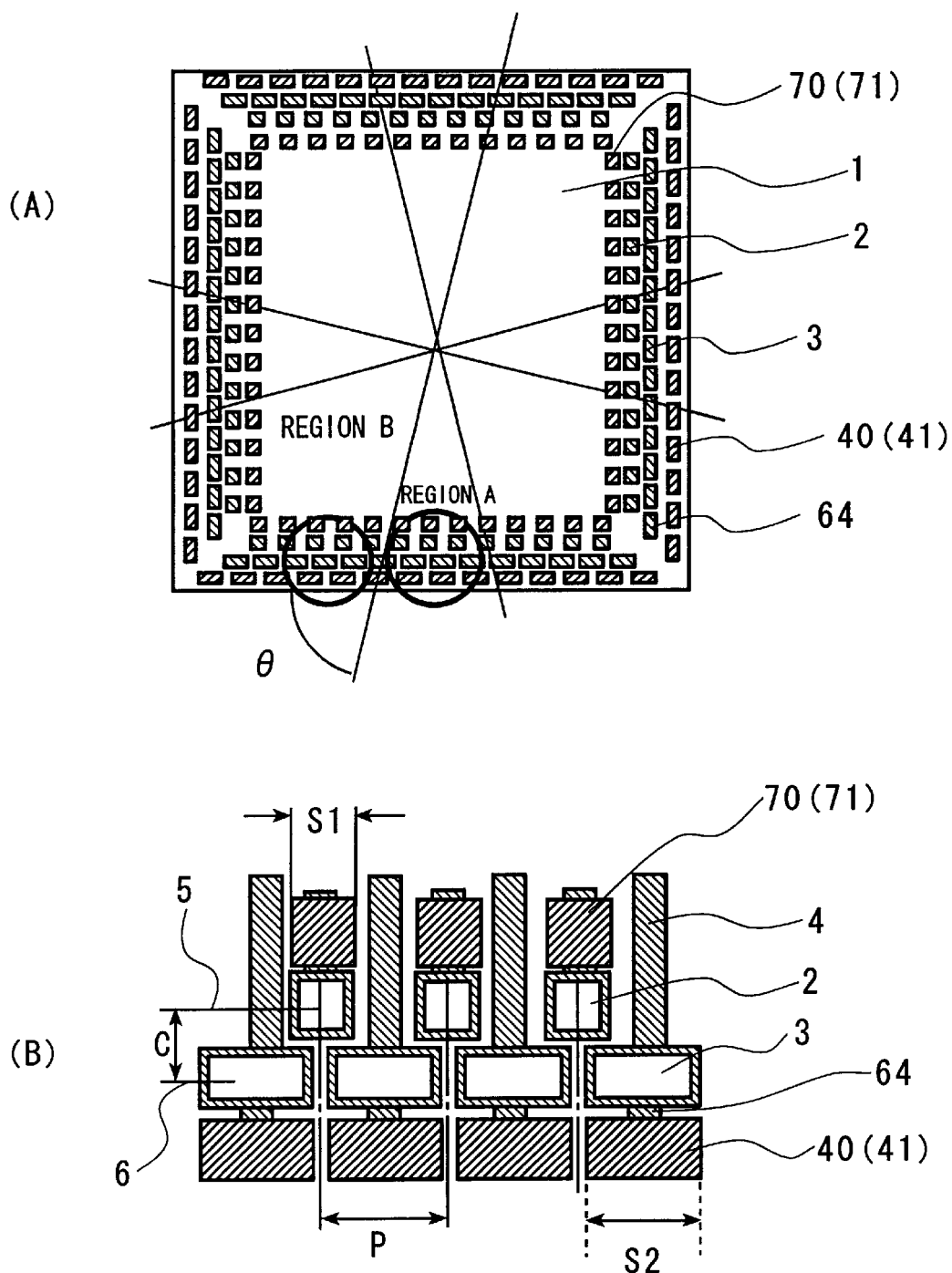
FIG. 12 illustrates a modified example of the semiconductor pellet of the third preferred embodiment.
Figure 13:
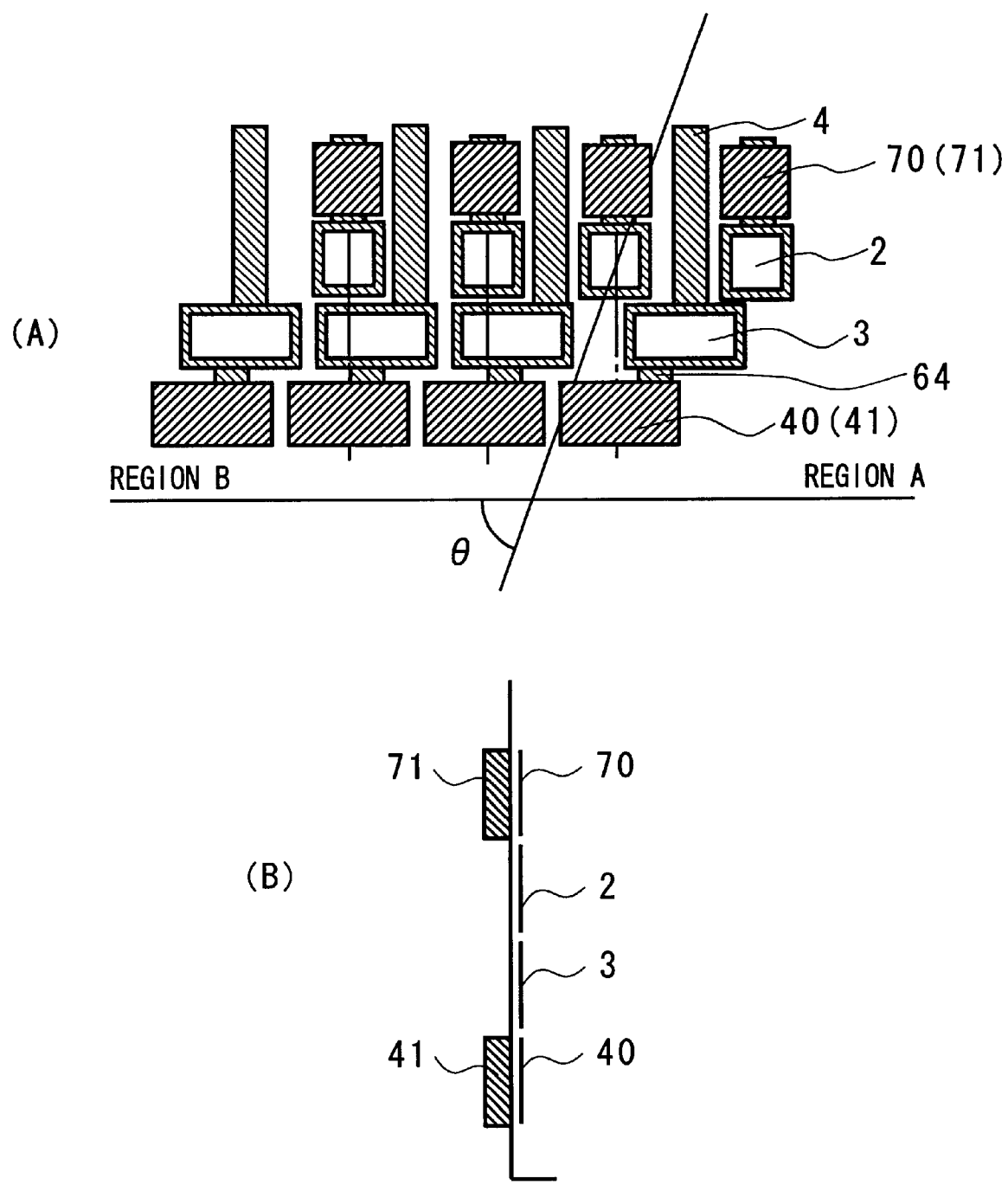
FIG. 13 illustrates a part of the modified example of the semiconductor pellet of the third preferred embodiment.

In the modified example of the semiconductor pellet 1 of the third preferred embodiment, as shown in FIG. 12(A), the second dummy electric pads 70 are arranged inside the first electric pads 2. Each of the second dummy electric pads 70 is electrically connected to each of the first electric pads 2 through an electrical wire 4. A metal layer 71 is provided on the second dummy electric pad 70 in the same way as the dummy electric pads 40. The explanation for the thickness and forming method of the metal layer 71 is omitted because they are the same as the metal layers 51. The second dummy electric pad 70 in which the metal layer 71 is provided can be used as an electric pad for undertaking an electric performance test in the same way as the dummy electric pads 40.

In the modified example of the third preferred embodiment, the electric performance test for the first electric pads 2 has the same result as the electric performance test for the second electric pads 3 in addition to the effect of the third preferred embodiment.

FIGS. 14(A) and 14(B) and FIGS. 15(A) and 15(B) illustrate a semiconductor is pellet of the fourth preferred embodiment of the present invention. In FIGS. 14(A) and 14(B) and FIGS. 15(A) and 15(B), the explanation is omitted for those parts with the same reference numbers as the parts in FIGS. 1(A) and 1(B) and FIG. 2.

Figure 14:
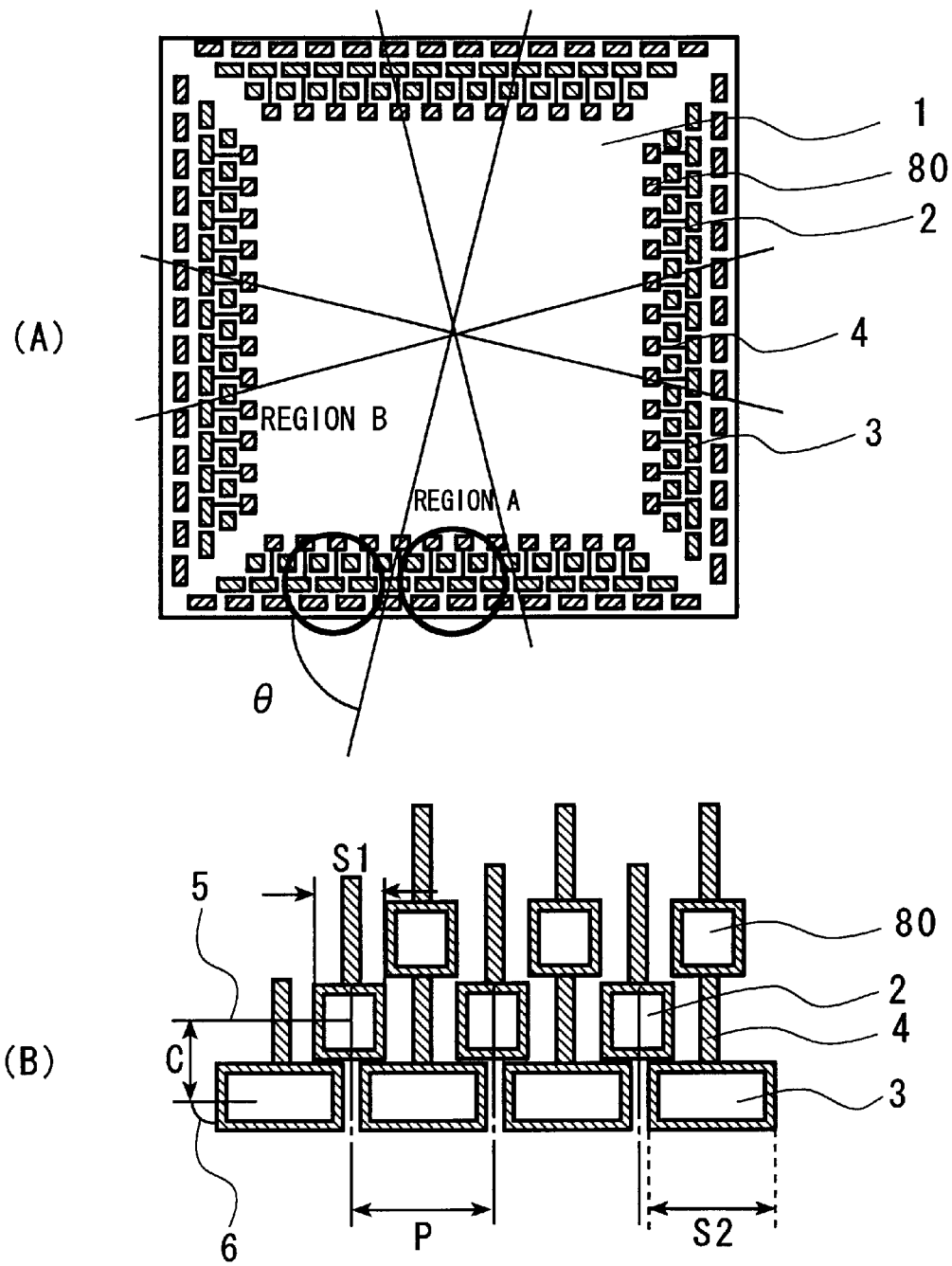
FIG. 14 illustrates a semiconductor pellet of the fourth preferred embodiment.

In the semiconductor pellet 1 of the fourth preferred embodiment, the third electric pads 80 are provided inside the first electric pads 2 as shown in FIG. 14(A). Each of the third electric pads 80 are electrically connected to each of the second electric pads 3 through an electrical wire 4. The explanation for the other parts is omitted because they are the same as the semiconductor pellet 1 of the first preferred embodiment.

Figure 15:
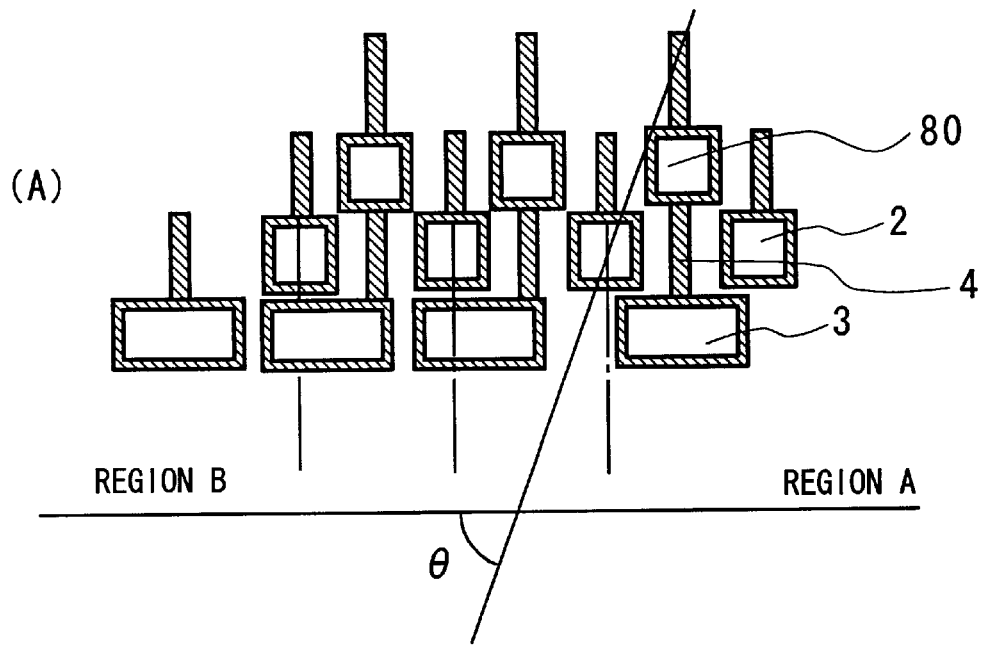
FIG. 15 illustrates a part of the semiconductor pellet of the fourth preferred embodiment.
Figure 15:
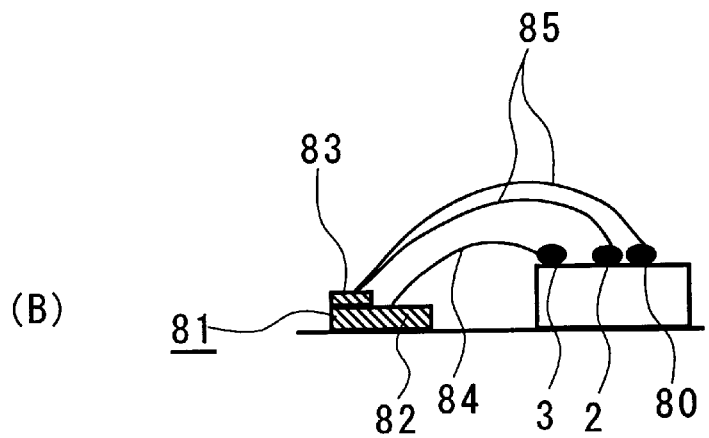

FIG. 15(B) is a sectional view showing an example in which the semiconductor pellet of the fourth preferred embodiment is wire-bonded to an external terminal. As shown in FIG. 15(B), terminals 82 and 83 each having a different height might be used in the external terminal 81 used for a package structure such as a ball grid alley. When the terminals 82 and 83 are wire-bonded to the semiconductor pellet 1, the second electric pad 3 outside the semiconductor pellet 1 is wire-bonded to the terminal 82 the position of which is low relative to the external terminal 81. This bonding is achieved using an electrical wire 84 the orbit of which is low. Further, the first electric pad 2 inside the semiconductor pellet 1 is wire-bonded to the terminal 83 the position of which is high relative to the external terminal 81. This is achieved using an electrical wire 85 the orbit of which is high. Thus, the second electric pads 3 and first electric pads 2 are allocated and connected to the terminal 82 the height of which is low and the terminal 83 the height of which is high respectively, according to the situation such as the location correlation and the electrical wire. There is a case however, in which the second electric pads 3 should be connected to the terminal 83 the position of which is high. In such a case, as shown in FIG. 5(B), the third electric pads 80 is wire-bonded to the terminal 83 the position of which is high using the electrical wire 85 the orbit of which is high.

As explained above, according to the fourth preferred embodiment, when the electric pad of the semiconductor pellet 1 is wire-bonded to an external terminal having a difference in height, it is possible to avoid short-circuiting an interval between thin metal wires in a case where the second electric pads 3 outside the semiconductor pellet 1 should be connected to the high positioned terminal.

As explained in detail above, according to the present invention, when the electric pad of the semiconductor pellet is wire-bonded to the external terminal of the lead frame, the package substrate, and so forth, it is possible to avoid short-circuiting the interval between the thin metal wires.

What is claimed is:

1. A semiconductor pellet having a central area and a peripheral area, comprising:

an integrated circuit formed in the central area of the pellet;

a plurality of first electric pads arranged in a line in the peripheral area of the pellet, said first pads having a first width S1 and arranged with a first interval P; and a plurality of second electric pads connected to the conductive lines each of which has a second width L, said second pads having a third width S2 and located outside of said first pads in a parallel line to the line of said first pads with a second interval C, wherein the first, second and third widths S1, L, S2 and the first interval P has the following relationship:

$$P>S2>S1+L;$$

wherein each of said second pads are located at the positions corresponding to the middle positions between the first pads adjoining each other where said second pads are located in a first area which is inside of straight lines from a center of the semiconductor pellet having an angle e with a side of the semiconductor pellet, in which $\theta > \tan^{-1}(2C/(P-S1))$; and wherein each of said second pads are located at the positions shifting in a direction towards a corner of the semiconductor pellet from the middle positions where said second pads are located in a second area which is outside of the first area.

2. The semiconductor pellet according to claim 1, wherein each of said first pads has a first outer side defining the first width S1 and each of said second pads has a second outer side defining the second width S2, and wherein the outer sides of said second pads located in the second area are aligned with the corresponding outer sides of said first pads.

3. The semiconductor pellet according to claim 1, wherein a shape of each of said first pads is substantially square.

4. The semiconductor pellet according to claim 1, wherein a shape of each of said first pads is a rectangle having a long side facing towards a center of the semiconductor pellet.

5. The semiconductor pellet according to claim 1, wherein a shape of each of said second pads is a rectangle having a short side facing towards a center of the semiconductor pellet.

* * * * *